(12) United States Patent
Umeda et al.

(10) Patent No.: US 11,075,154 B2
(45) Date of Patent: Jul. 27, 2021

(54) SEMICONDUCTOR DEVICE AND METHOD OF MANUFACTURING SEMICONDUCTOR DEVICE

(71) Applicant: SHINDENGEN ELECTRIC MANUFACTURING CO., LTD., Tokyo (JP)

(72) Inventors: Soichiro Umeda, Saitama (JP); Atsushi Kyutoku, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 9 days.

(21) Appl. No.: 16/630,703

(22) PCT Filed: Oct. 26, 2017

(86) PCT No.: PCT/JP2017/038758
§ 371 (c)(1),
(2) Date: Jan. 13, 2020

(87) PCT Pub. No.: WO2019/082345
PCT Pub. Date: May 2, 2019

(65) Prior Publication Data
US 2020/0395284 A1 Dec. 17, 2020

(51) Int. Cl.
*H01L 23/498* (2006.01)
*H01L 21/48* (2006.01)
*H01L 21/8234* (2006.01)

(52) U.S. Cl.
CPC ...... *H01L 23/49838* (2013.01); *H01L 21/485* (2013.01); *H01L 21/823475* (2013.01); *H01L 23/49822* (2013.01); *H01L 23/49861* (2013.01)

(58) Field of Classification Search
None
See application file for complete search history.

(56) References Cited

U.S. PATENT DOCUMENTS 6,613,829 B2 *  9/2003  Fukuizumi ............ H01L 24/48
                                                524/439
6,777,800 B2 *  8/2004  Madrid ............ H01L 23/49524
                                                257/690
(Continued)

FOREIGN PATENT DOCUMENTS

JP    H01100957 A    4/1989
JP    H06224261 A    8/1994
(Continued)

OTHER PUBLICATIONS

Supplementary European Search Report for European Application No. 17929736.1, dated Jul. 20, 2020.
(Continued)

*Primary Examiner* — David E Graybill
(74) *Attorney, Agent, or Firm* — Marshall, Gerstein & Borun LLP

(57) ABSTRACT

A semiconductor device includes: a lead frame that has one end in contact with the upper surface of the second terminal of the semiconductor element in the sealing portion, and that has the other end exposed from the sealing portion; and a control conductive bonding material that bonds between the upper surface of the second terminal of the semiconductor element and the one end of the lead frame, and the control conductive bonding material having electric conductivity.

14 Claims, 16 Drawing Sheets

(56) References Cited

U.S. PATENT DOCUMENTS

| | | | |
|---|---|---|---|
| 6,849,930 B2* | 2/2005 | Nakajima | H01L 23/49524 257/666 |
| 6,903,450 B2* | 6/2005 | Funato | H01L 23/49524 257/666 |
| 7,385,279 B2* | 6/2008 | Hirashima | H01L 24/81 257/666 |
| 7,432,594 B2* | 10/2008 | Ashida | H01L 21/566 257/735 |
| 7,618,896 B2* | 11/2009 | Joshi | H01L 23/49575 438/728 |
| 7,659,611 B2* | 2/2010 | Otremba | H01L 23/3107 257/690 |
| 7,683,464 B2* | 3/2010 | Sun | H01L 24/40 257/666 |
| 7,884,469 B2* | 2/2011 | Shi | H01L 24/40 257/720 |
| 7,999,365 B2* | 8/2011 | Hu | H01L 24/41 257/676 |
| 8,013,441 B2* | 9/2011 | Bauer | H01L 23/49524 257/735 |
| 8,354,740 B2* | 1/2013 | Liu | H01L 23/49524 257/675 |
| 8,426,952 B2* | 4/2013 | Cho | H01L 24/36 257/666 |
| 8,564,049 B2* | 10/2013 | Sun | H01L 29/66734 257/329 |
| 8,680,627 B2* | 3/2014 | Cho | H01L 23/49562 257/401 |
| 9,059,153 B2* | 6/2015 | Fukui | H01L 23/49524 |
| 9,171,817 B2* | 10/2015 | Miyakawa | H01L 23/49527 |
| 9,418,918 B2* | 8/2016 | Groenhuis | H01L 23/49524 |
| 9,496,208 B1* | 11/2016 | Ostrowicki | H01L 23/49562 |
| 9,711,436 B2* | 7/2017 | Gehrke | H01L 23/49524 |
| 9,818,677 B2* | 11/2017 | Liu | H01L 23/49575 |
| 9,899,481 B2 | 2/2018 | Otremba | H01L 23/49575 |
| 9,922,905 B2 | 3/2018 | Yato | H01L 24/77 |
| 9,966,327 B2 | 5/2018 | Kamiyama | H01L 23/49531 |
| 2002/0047187 A1* | 4/2002 | Nakajima | H01L 23/49524 257/666 |
| 2002/0098625 A1* | 7/2002 | Fukuizumi | H01L 24/85 438/124 |
| 2004/0063240 A1* | 4/2004 | Madrid | H01L 24/73 438/106 |
| 2004/0135237 A1* | 7/2004 | Funato | H01L 24/29 257/673 |
| 2006/0043618 A1* | 3/2006 | Ashida | H01L 23/49562 257/427 |
| 2007/0057368 A1* | 3/2007 | Ho | H01L 24/41 257/735 |
| 2007/0075406 A1* | 4/2007 | Ho | H01L 24/37 257/666 |
| 2007/0145582 A1* | 6/2007 | Otremba | H01L 23/49562 257/728 |
| 2007/0158819 A1* | 7/2007 | Hirashima | H01L 23/49562 257/692 |
| 2007/0176266 A1* | 8/2007 | Kawano | H01L 24/84 257/622 |
| 2007/0249092 A1* | 10/2007 | Joshi | H01L 23/49575 438/107 |
| 2007/0290336 A1* | 12/2007 | Sun | H01L 24/40 257/735 |
| 2008/0211070 A1* | 9/2008 | Sun | H01L 29/045 257/676 |
| 2008/0224300 A1* | 9/2008 | Otremba | H01L 24/81 257/693 |
| 2009/0072368 A1* | 3/2009 | Hu | H01L 23/49844 257/676 |
| 2009/0212405 A1* | 8/2009 | Liu | H01L 24/97 257/670 |
| 2009/0218676 A1* | 9/2009 | Muto | H01L 24/05 257/693 |
| 2009/0236708 A1* | 9/2009 | Shi | H01L 24/40 257/675 |
| 2010/0133670 A1* | 6/2010 | Liu | H01L 23/49575 257/675 |
| 2012/0181624 A1* | 7/2012 | Cho | H01L 23/49575 257/401 |
| 2012/0181674 A1* | 7/2012 | Cho | H01L 25/071 257/666 |
| 2012/0181996 A1* | 7/2012 | Gehrke | H01L 24/41 323/271 |
| 2012/0200281 A1* | 8/2012 | Herbsommer | H01L 23/49575 323/311 |
| 2012/0217626 A1* | 8/2012 | Sakai | H01L 21/4825 257/666 |
| 2015/0262915 A1* | 9/2015 | Suzuki | H01L 24/37 257/329 |
| 2016/0284632 A1* | 9/2016 | Shinohara | H01L 23/3121 |
| 2016/0379919 A1* | 12/2016 | Otremba | H01L 23/49562 257/675 |
| 2017/0025331 A1* | 1/2017 | Kamiyama | H01L 21/4842 |
| 2017/0025335 A1* | 1/2017 | Liu | H01L 24/73 |
| 2017/0170100 A1* | 6/2017 | Yato | H01L 23/49805 |
| 2017/0207306 A1* | 7/2017 | Otremba | H01L 23/49562 |

FOREIGN PATENT DOCUMENTS

| | | |
|---|---|---|
| JP | H09092771 A | 4/1997 |
| JP | 2008-306115 A | 12/2008 |
| JP | 2009-049272 A | 3/2009 |
| JP | 2010-118577 A | 5/2010 |
| JP | 2015-12065 A | 1/2015 |
| JP | 2015-026791 A | 2/2015 |
| JP | 2015-050340 A | 3/2015 |
| JP | 2015-090965 A | 5/2015 |
| WO | WO 2016/084483 | 6/2016 |

OTHER PUBLICATIONS

International Application No. PCT/JP2017/038758, International Search Report, dated Jan. 16, 2018.
International Application No. PCT/JP2017/038758, International Preliminary Report on Patentability, dated Apr. 30, 2020.

* cited by examiner

SEMICONDUCTOR DEVICE AND METHOD OF MANUFACTURING SEMICONDUCTOR DEVICE

TECHNICAL FIELD

The present invention relates to a semiconductor device and a method of manufacturing the semiconductor device.

BACKGROUND

Conventionally, for example, a semiconductor device in which a semiconductor element is mounted on a conductor layer of a substrate is known (see, for example, Patent Document 1). In the semiconductor device, the semiconductor element and the lead frame are bonded with a connector via a conductive bonding material such as solder, and the semiconductor element and the substrate are sealed with a sealing resin.

In such a conventional semiconductor device, a conductive bonding material such as a solder material may be applied to connect a lead frame and a semiconductor element (such as a MOSFET or 1GBT). In this case, there is a limit to reducing the amount of solder while maintaining the solder particle size, and the cost increases as the solder particle size decreases.

And in order to suppress the solder bridge between different electrodes without reducing the amount of solder, it is necessary to prevent the solder material in contact with the lead frame from protruding from the upper surface of the gate pad (the terminal) to which the control signal of the semiconductor element is input.

In consideration of electrical characteristics, it is necessary to reduce the area of the gate pad and increase the area of the source pad. For this reason, it is necessary to make the junction between the lead frame and the gate pad as small as possible.

Also, in order to reduce the area occupied by the semiconductor device while increasing the allowable current value, it is necessary to increase the thickness of the lead frame.

Such a thick lead frame is difficult to process corresponding to a gate pad having a small area.

That is, in the conventional semiconductor device, the joint portion of the thick lead frame connected to the terminal is processed corresponding to the shape of the terminal to which the control signal is input, and the terminal and the lead frame are joined, there was a problem that the conductive bonding material could not be suppressed from protruding from the upper surface of the terminal.

PRIOR ART DOCUMENTS

Patent Document

[Patent Document 1] JP2015-12065

DISCLOSURE OF THE INVENTION

Problem to be Solved by the Invention

Accordingly, an object of the present invention provides a semiconductor device capable of easily processing a joint portion of a lead frame connected to a terminal corresponding to the shape of the terminal to which a control signal (control signal) is input, and the semiconductor device suppresses the conductive bonding material from protruding from the upper surface of the terminal when the terminal and the lead frame are bonded.

Solution to Problem

A semiconductor device according to the embodiment of one aspect of the present invention, includes:

a substrate provided with a first conductive layer on an upper surface of the substrate;

a semiconductor element disposed on the upper surface of the substrate, the semiconductor element has: a first terminal provided on a lower surface of the semiconductor element and electrically connected to the first conductive layer, and a second terminal provided on an upper surface of the semiconductor element and receiving a control signal;

a sealing portion that seals the substrate and the semiconductor element;

a lead frame that has one end in contact with the upper surface of the second terminal of the semiconductor element in the sealing portion, and that has the other end exposed from the sealing portion; and a control conductive bonding material that bonds between the upper surface of the second terminal of the semiconductor element and the one end of the lead frame, and the control conductive bonding material having electric conductivity, wherein the one end portion of the lead frame includes:

a reference portion;

an intermediate portion connected to the reference portion and located on the tip side of the one end portion of the lead frame relative to the reference portion; and an inclined portion connected to the intermediate portion and located at the tip of the one end portion of the lead frame, and the inclined portion having a shape inclined downward from the intermediate portion, and wherein vertical thickness of the inclined portion and the intermediate portion are thinner than a vertical thickness of the reference portion.

In the semiconductor device,
wherein
the upper surface of the second terminal has a rectangular shape, the inclined portion is located at least on a center of the upper surface of the second terminal, the control conductive bonding material is located between the lower surface of the inclined portion and the center of the upper surface of the second terminal, and the lower surface of the inclined portion and the upper surface of the second terminal are bonded by the control conductive bonding material.

In the semiconductor device,
wherein, in a region near a first side of the upper surface of the second terminal that is offset from the center of the upper surface of the second terminal, a tip of the inclined portion is in line contact with the upper surface of the second terminal in a direction parallel to the first side.

In the semiconductor device,
wherein the control conductive bonding material is continuously provided from a region of the upper surface of the second terminal near the first side where at least a tip of the inclined portion is in contact with the second terminal, to a region of the upper surface of the second terminal near the second side facing the first side, via the center of the upper surface of the second terminal.

In the semiconductor device,
wherein a vertical thickness of the inclined portion is the same as a vertical thickness of the intermediate portion.

In the semiconductor device,
wherein a width of the inclined portion is smaller than a width of the reference portion.

In the semiconductor device,
wherein the intermediate portion is formed such that a width of the intermediate portion becomes narrower from the reference portion toward the inclined portion.

In the semiconductor device,
wherein the semiconductor device is a MOSFET having the first terminal that is a drain terminal, the second terminal is a gate terminal, and a source terminal, which is a third terminal having an area larger than the second terminal, the source terminal provided on an upper surface of the MOSFET.

In the semiconductor device,
wherein the lead frame is a control lead frame to which the control signal for controlling the MOSFET is input,
wherein the semiconductor device further comprises:
a drain lead frame has one end that is in contact with the upper surface of the first conductive layer at the end extending in the side direction of the upper surface of the substrate in the sealing portion, and has the other end is exposed from the sealing portion; and
a first conductive bonding material that bonds between the upper surface of the first conductive layer and the lower surface side of the one end of the drain lead frame at the end of the substrate, and has electrical conductivity, and
wherein a vertical thickness of the control lead frame is the same as a vertical thickness of the drain lead frame.

In the semiconductor device,
wherein a width of the one end portion of the control lead frame is smaller than a width of the one end portion of the first lead frame.

In the semiconductor device,
wherein the one end portion and the other end portion of the first lead frame have the same thickness.

In the semiconductor device,
wherein the control conductive bonding material and the first conductive bonding material are the same solder material.

In the semiconductor device,
wherein the first conductive bonding material is disposed along a reference direction in which the first bent portion of the first lead frame is in line contact with the upper surface of the first conductive layer, and
wherein the end portion of the substrate is joined between the upper surface of the first conductive layer and the lower surface side of the first bent portion.

In the semiconductor device,
wherein the first lead frame has a main body portion positioned between the one end portion and the other end portion, and the main body portion sealed in the sealing portion.

A method of manufacturing a semiconductor device according to an embodiment of one aspect of the present invention includes:
preparing a substrate provided with a first conductive layer on an upper surface of the substrate;
disposing a semiconductor element on the upper surface of the substrate, the semiconductor element has: a first terminal provided on a lower surface of the semiconductor element and electrically connected to the first conductive layer, and a second terminal provided on an upper surface of the semiconductor element and receiving a control signal;
bringing one end of a lead frame into contact with the upper surface of the second terminal of the semiconductor element;
bonding between the upper surface of the second terminal of the semiconductor element and the one end of the lead frame by a control conductive bonding material, and the control conductive bonding material having electric conductivity; and
sealing the substrate, the semiconductor element, and the one end of the lead frame by a sealing portion,
wherein the one end portion of the lead frame includes:
a reference portion;
an intermediate portion connected to the reference portion and located on the tip side of the one end portion of the lead frame relative to the reference portion; and
an inclined portion connected to the intermediate portion and located at the tip of the one end portion of the lead frame, and the inclined portion having a shape inclined downward from the intermediate portion, and
wherein vertical thickness of the inclined portion and the intermediate portion are thinner than a vertical thickness of the reference portion.

Effects of the Invention

The semiconductor device according to one embodiment of the present invention includes: a substrate provided with a first conductive layer on an upper surface of the substrate; a semiconductor element disposed on the upper surface of the substrate, the semiconductor element has: a first terminal provided on a lower surface of the semiconductor element and electrically connected to the first conductive layer, and a second terminal provided on an upper surface of the semiconductor element and receiving a control signal; a sealing portion that seals the substrate and the semiconductor element; a control lead frame that has one end in contact with the upper surface of the second terminal of the semiconductor element in the sealing portion, and that has the other end exposed from the sealing portion; and a control conductive bonding material that bonds between the upper surface of the second terminal of the semiconductor element and the one end of the control lead frame, and the control conductive bonding material having electric conductivity.

Furthermore, the one end portion of the lead frame includes: a reference portion; an intermediate portion connected to the reference portion and located on the tip side of the one end portion of the lead frame relative to the reference portion; and an inclined portion connected to the intermediate portion and located at the tip of the one end portion of the lead frame, and the inclined portion having a shape inclined downward from the intermediate portion. And, vertical thickness of the inclined portion and the intermediate portion are thinner than a vertical thickness of the reference portion.

In the semiconductor device of the present invention, for example, only the periphery of the junction with the second terminal (the gate pad) of the control lead frame is thinned. Then, after reducing the plate thickness, the shape is punched again. Thereby, the microfabrication can be partially performed.

Furthermore, it is possible to provide a space for preventing the control conductive bonding material (solder material) from protruding from the second terminal when the lead frame is mounted, and to partially make a line contact with the second terminal.

Further, the inclined portion where the thickness of the control lead frame is thin can be easily formed by bending, and the area of the second terminal can be reduced.

That is, according to the semiconductor device of the present invention, the joint portion of the lead frame connected to the terminal can be easily processed corresponding to the shape of the terminal to which a control signal (control signal) is input. Furthermore, it is possible to suppress the conductive bonding material from protruding from the upper surface of the terminal, when the terminal and the lead frame are bonded.

EMBODIMENTS FOR CARRYING OUT THE INVENTION

Embodiments of the present invention will now be described with reference to the accompanying drawings.

Embodiment

Figure 1:
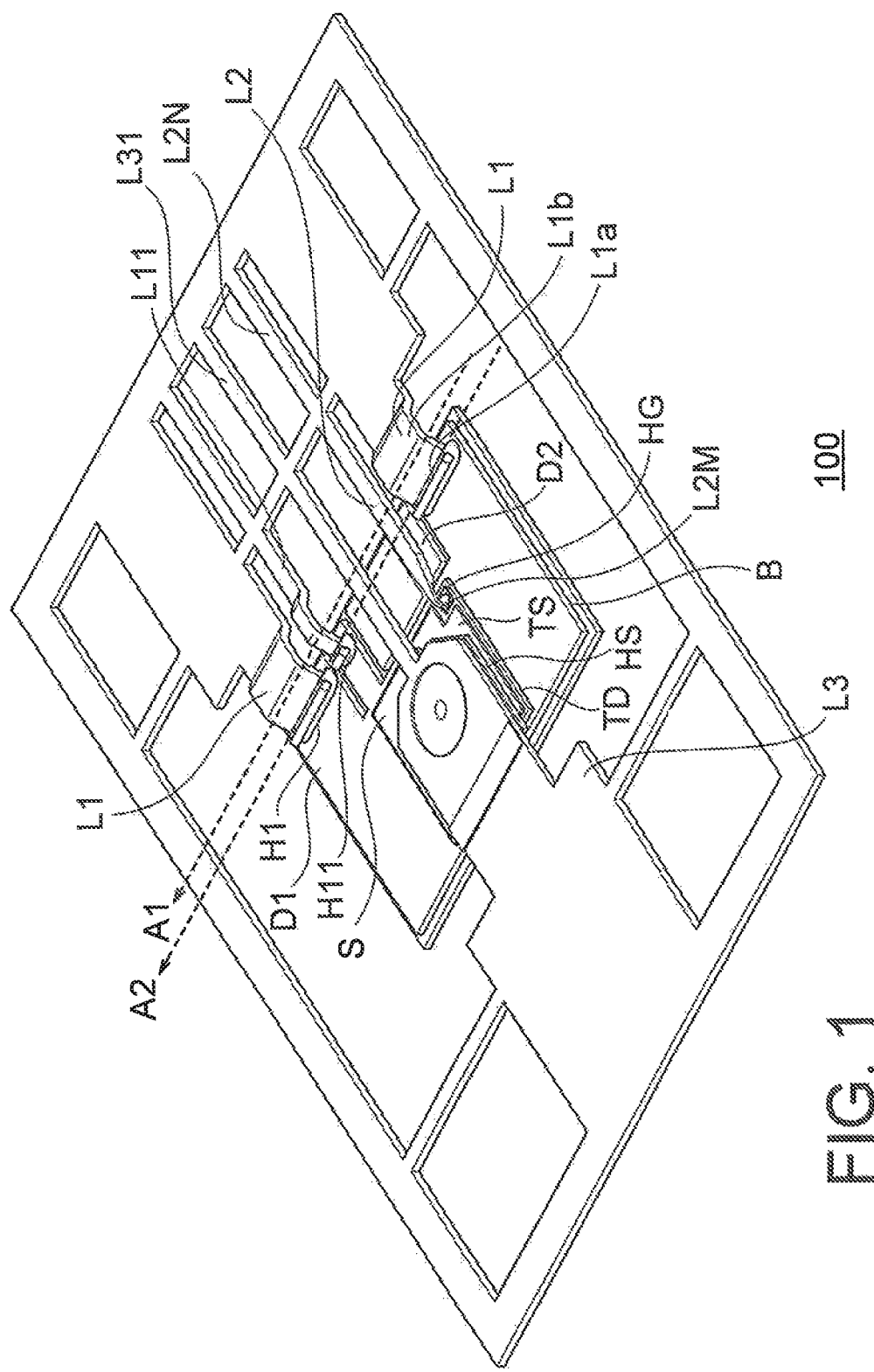
FIG. 1 is a perspective view showing an example of a configuration of a semiconductor device 100 before sealing.
Figure 2:
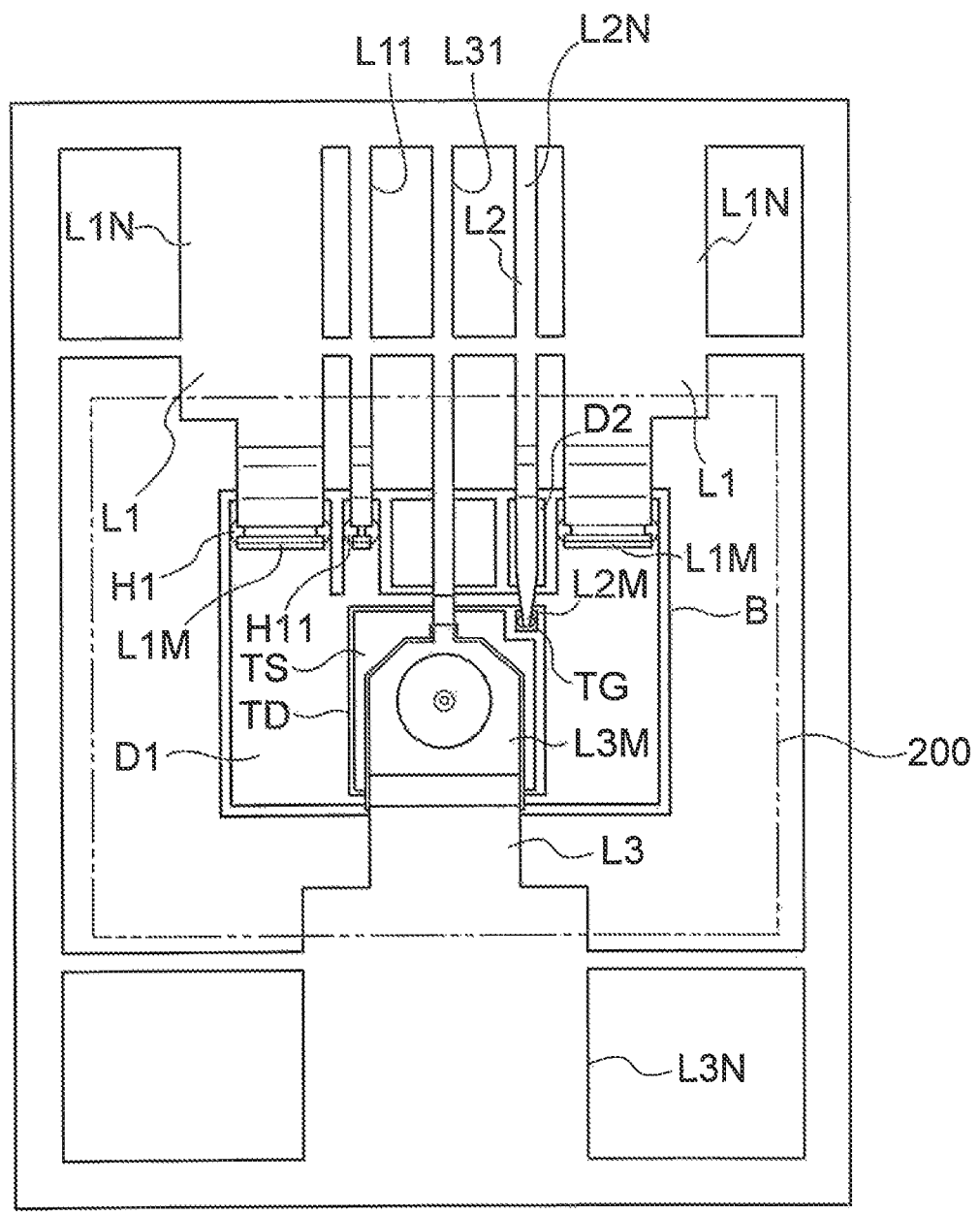
FIG. 2 is a top view showing an example of the configuration of the semiconductor device 100 after sealing and before cutting the lead frame.
Figure 3:
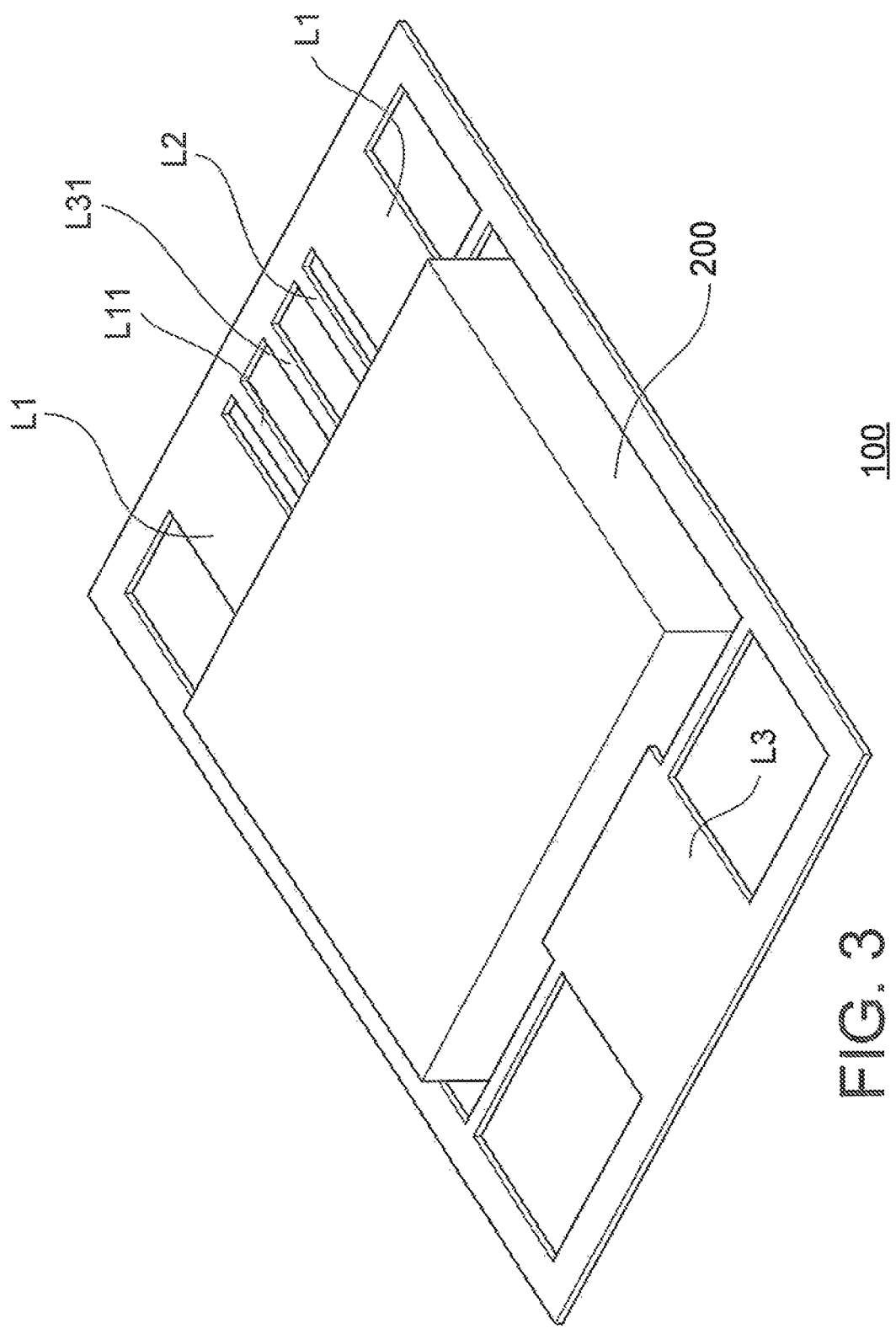
FIG. 3 is a perspective view showing an example of the configuration of the semiconductor device 100 after sealing and before cutting the lead frame.
Figure 4:
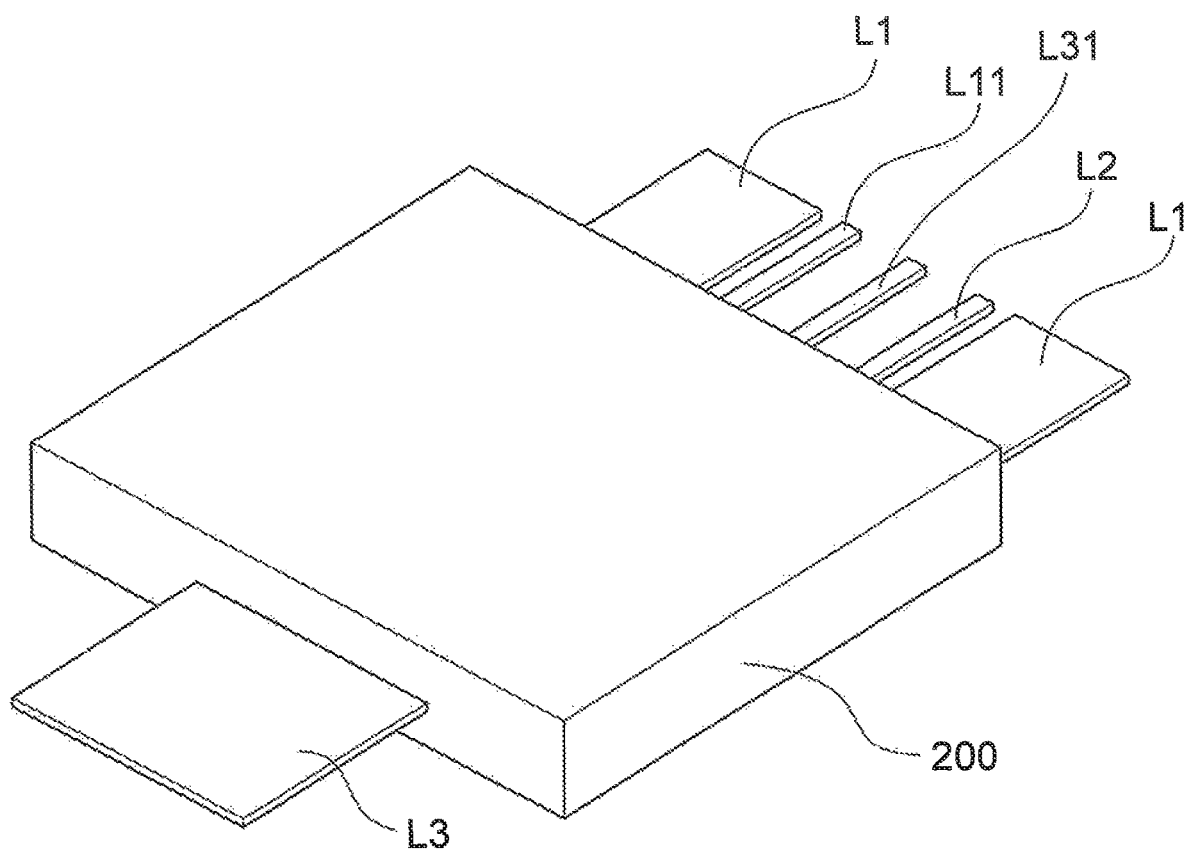
FIG. 4 is a perspective view showing an example of the configuration of the semiconductor device 100 after the lead frame is cut.

FIG. 1 is a perspective view showing an example of a configuration of a semiconductor device 100 before sealing. FIG. 2 is a top view showing an example of the configuration of the semiconductor device 100 after sealing and before cutting the lead frame. FIG. 3 is a perspective view showing an example of the configuration of the semiconductor device 100 after sealing and before cutting the lead frame. FIG. 4 is a perspective view showing an example of the configuration of the semiconductor device 100 after the lead frame is cut. In the example of FIG. 1, a case where there are two first lead frames L1 is shown. Moreover, the example of FIG. 2 is illustrated as if the sealing member was transmitted.

Figure 5A:
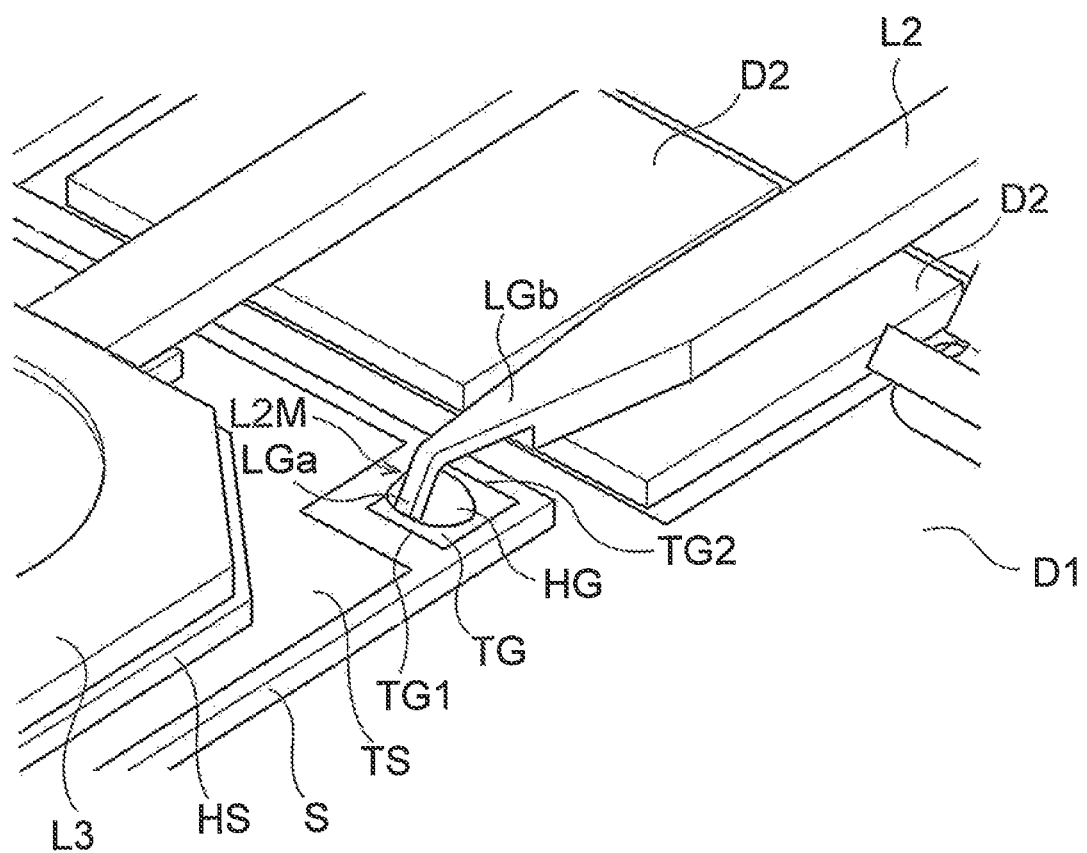
FIG. 5A is an enlarged perspective view of a region in the vicinity of one end L2M of the second lead frame L2 of the semiconductor device 100 shown in FIG. 1.
Figure 5B:
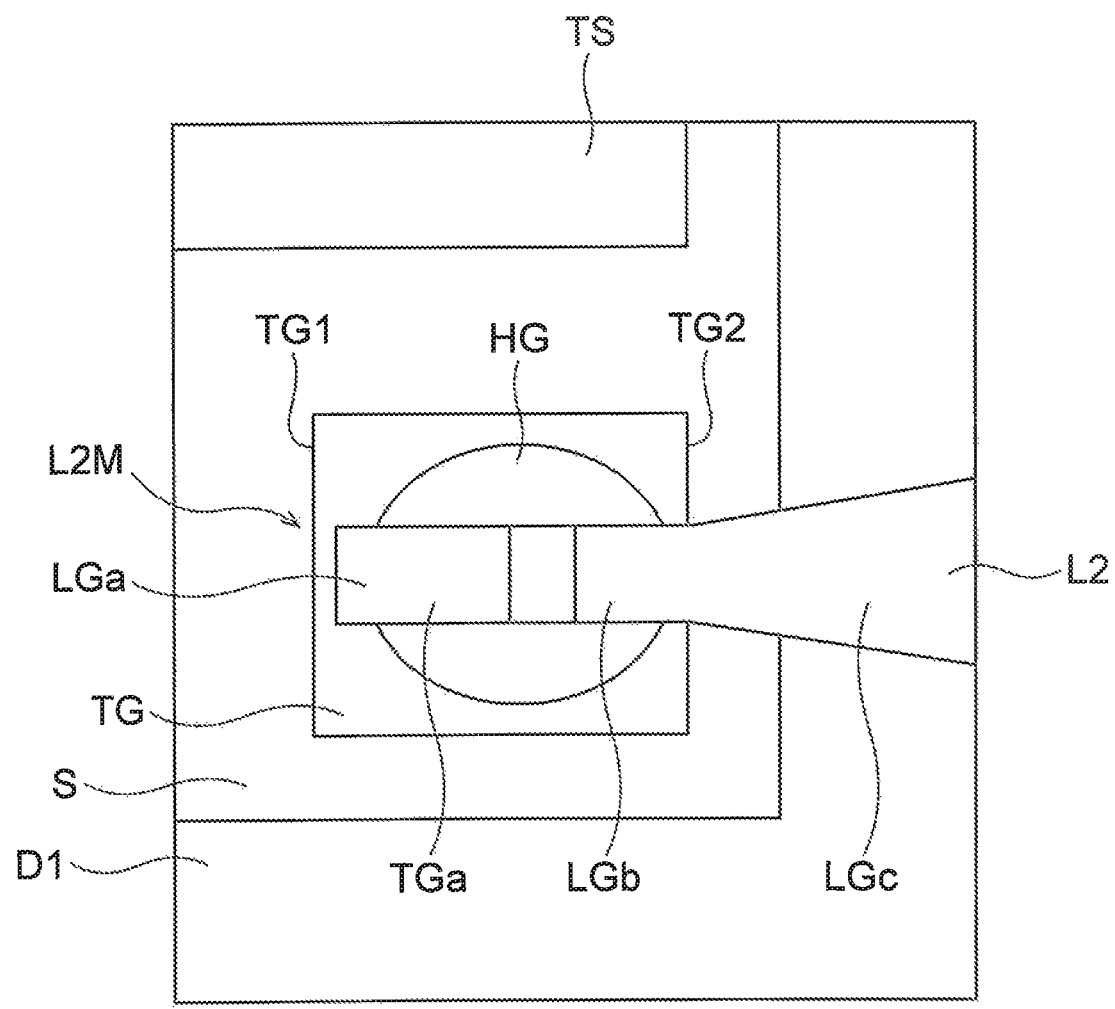
FIG. 5B is a top view further enlarging a region in the vicinity of one end L2M of the second lead frame L2 shown in FIG. 5A.
Figure 5C:
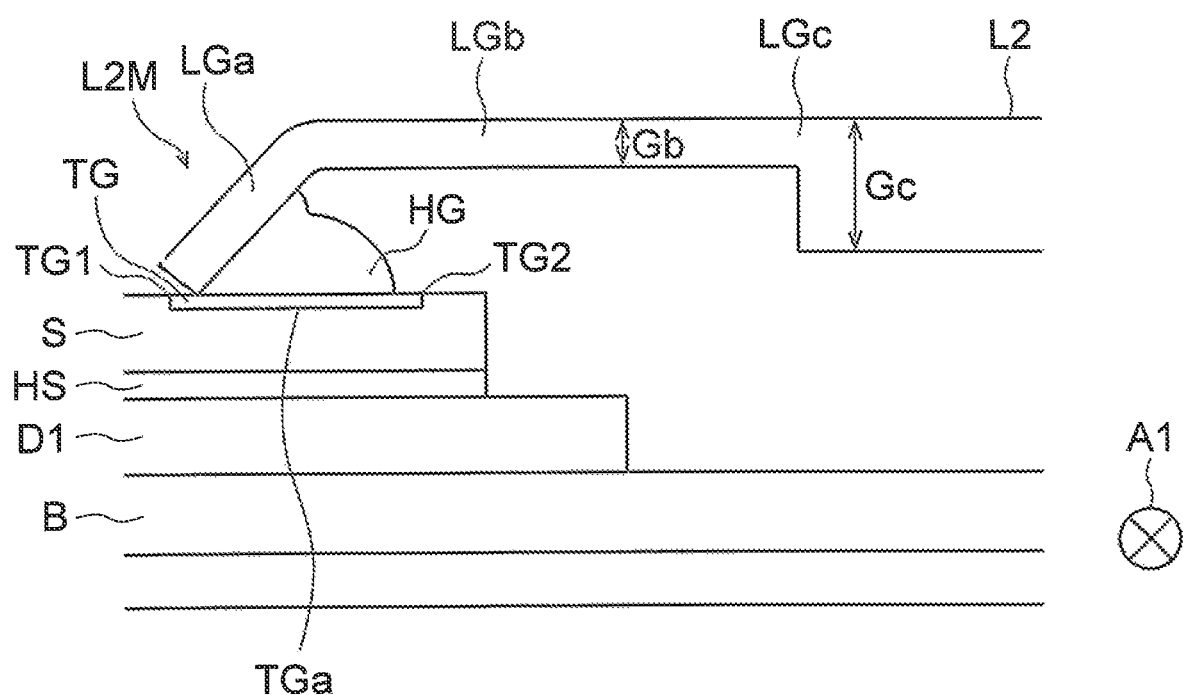
FIG. 5C is a cross sectional view showing an example of a cross section perpendicular to the side direction A1 of a region in the vicinity of one end L2M of the second lead frame L2 shown in FIG. 5B.

FIG. 5A is an enlarged perspective view of a region in the vicinity of one end L2M of the second lead frame L2 of the semiconductor device 100 shown in FIG. 1. FIG. 5B is a top view further enlarging a region in the vicinity of one end L2M of the second lead frame L2 shown in FIG. 5A. FIG. 5C is a cross sectional view showing an example of a cross section perpendicular to the side direction A1 of a region in the vicinity of one end L2M of the second lead frame L2 shown in FIG. 5B.

For example, as shown in FIGS. 1 to 4, the semiconductor device 100 includes a substrate B, a semiconductor element S, a sealing portion 200, a first lead frame (drain lead frame) L1, a detection lead frame L11, a first conductive bonding material H1, a drain conductive bonding material HD, a second lead frame (control lead frame) L2, a control conductive bonding material HG, a third lead frame (source lead frame) L3, a source conductive bonding material HS, and a detection lead frame L31.

As shown in FIGS. 1 and 2, the substrate B is provided with a plurality of conductive layers (a first conductive layer D1 and a second conductive layer D2) on a upper surface of the substrate B.

Also, as shown in FIGS. 1 and 2, the semiconductor element S is disposed on the upper surface of the substrate B. In the semiconductor element S, the first terminal TD on the lower surface side of the semiconductor element S is electrically connected to the first conductive layer D1 provided on the upper surface of the substrate B.

For example, as shown in FIGS. 1 and 2, the semiconductor element S includes a first terminal (drain terminal) TD, a second terminal (gate terminal) TG, and a third terminal (source terminal) TS.

The first terminal TD is provided on the lower surface of the semiconductor element S and is electrically connected to the first conductive layer D1.

Further, the second terminal TG is provided on the upper surface of the semiconductor element S, and a control signal (gate signal) is input to the second terminal TG.

Note that the semiconductor element S is, for example, a MOSFET. In this case, the semiconductor element S is a MOSFET having a first terminal TD that is a drain terminal provided on the lower surface of the semiconductor element S, having a second terminal TG that is a gate terminal provided on the upper surface the semiconductor element S, and having a third terminal TS that is a source terminal provided on the upper surface of the semiconductor element S.

The semiconductor element S may be other semiconductor elements such as IGBT other than MOSFET.

As shown in FIGS. 1 and 2, the first lead frame L1 has one end portion L1M electrically connected to the first terminal TD which is a drain terminal in the sealing portion 200, and has the other end portion L1N exposed from the sealing portion 200.

In particular, the one end portion L1M of the first lead frame L1 is in contact with the upper surface of the first conductive layer D1 at the end extending in the side direction A1 of the upper surface of the substrate B in the sealing portion 200. And, the other end portion L1N of the first lead frame L1 is exposed from the sealing portion 200.

The one end portion L1M of the first lead frame L1 includes a first arch portion L1b and a first bent portion L1a.

The first arch portion L1b is provided so as to protrude upward along the reference direction A2.

And, the first bending portion L1a is connected with the first arch portion L1b, and is located in the front end side rather than the first arch portion L1b. Furthermore, the first bent portion L1a is bent so as to protrude downward along the reference direction A2.

The lower surface side of the first bent portion L1a is in line contact with the upper surface of the first conductive layer D12 along the reference direction A2.

Further, the first conductive bonding material H1 bonds between the upper surface of the first conductive layer D1 and the lower surface side of the one end L1M of the first lead frame L1 at the end of the substrate B. Furthermore, the first conductive bonding material H1 has electrical conductivity.

Note that the first conductive bonding material H1 is, for example, a solder material.

Further, one end of the detection lead frame L11 is electrically connected to the first terminal TD which is a drain terminal in the sealing unit 200. Furthermore, the other end portion of the detection lead frame L11 is exposed from the sealing portion 200.

The detection lead frame L11 is for detecting the drain voltage of the semiconductor element S, for example.

Then, the detection conductive bonding material H11 bonds the first conductive layer D1 and one end portion of the detection lead frame L11. Further, the detection conductive bonding material H11 has electrical conductivity.

Note that the conductive bonding material for detection H11 is, for example, a solder material.

For example, as shown in FIGS. 1 and 2, one end portion L2M of the second lead frame L2 is in contact with the upper surface of the second conductive layer provided at the end of the upper surface of the substrate B in the sealing portion 200. Further, the other end portion L2N of the second lead frame L2 is exposed from the sealing portion 200.

The second lead frame L2 is a control lead frame for transmitting the gate signal of the MOSFET (semiconductor element S) described above.

Then, the control conductive bonding material HG bonds between the upper surface of the second terminal (gate terminal) TG of the semiconductor element S and the one end L2M of the second lead frame L2. Further, the control conductive bonding material HG has electrical conductivity. Note that the conductive bonding material HG is, for example, a solder material.

Also, the one end portion L2M of the second lead frame L2 includes a second arch portion L2b and a second bent portion L2a.

The second arch portion L2b is provided so as to protrude upward along the reference direction A2.

The second bent portion L2a is connected to the second arch portion L2b and is located on the tip side with respect to the second arch portion L2b. The second bent portion L2a is bent so as to protrude downward along the reference direction A2.

The lower side of the second bent portion L2a is in line contact with the upper surface of the second conductive layer D2 along the reference direction A2.

Further, the width in the reference direction A2 of the one end portion L1M of the first lead frame L1 is set to be larger than the width in the reference direction A2 of the one end portion L2M of the second lead frame L2.

Also, one end L3M of the third lead frame L3 is electrically connected to the third terminal TS which is the source terminal on the upper surface of the semiconductor element S. Furthermore, the other end L3N of the third lead frame L3 is exposed from the sealing portion 200.

Then, the source conductive bonding material HS bonds between the third terminal TS and the one end L3M of the third lead frame L3. Further, the source conductive bonding material HS has electrical conductivity.

The source conductive bonding material HS is, for example, a solder material.

The one end of the detection lead frame L31 is electrically connected to the third terminal TS that is the source terminal on the upper surface of the semiconductor element S (that is, the one end of the detection lead frame L31 extends from the third lead frame L3). Further, the other end portion of the detection lead frame L31 is exposed from the sealing portion 200.

The detection lead frame L31 is for detecting the voltage of the source of the semiconductor element S, for example.

Further, as shown in FIGS. 1 to 4, the sealing portion 200 is configured to seal the substrate B and the semiconductor element S.

First Example

Here, in the example shown in FIGS. 5A, 5B, and 5C, the area of the source terminal that is the third terminal TS on the upper surface of the semiconductor element S is larger than the area of the second terminal TG that is the gate terminal.

As described above, one end L2M of the second lead frame L2 is in contact with the upper surface of the second terminal (gate terminal) TG of the semiconductor element S in the sealing portion 200. The control conductive bonding material HG joins between the upper surface of the second terminal (gate terminal) TG of the semiconductor element S and the one end L2M of the second lead frame L2, and has electrical conductivity.

Note that the control conductive bonding material HG is the same solder material as the first conductive bonding material H1.

The one end portion L2M of the second lead frame L2 includes a reference portion LGc as shown in FIGS. 5A to 5C, for example. Furthermore, the one end portion L2M of the second lead frame L2 includes an intermediate portion LGb that is connected to the reference portion LGc and is located on the tip end side of the one end portion L2M with respect to the reference portion LGc. Furthermore, the one end portion L2M of the second lead frame L2 includes an inclined portion LGa that is connected to the intermediate portion LGb and the inclined portion LGa is located at the tip of the one end portion L2M. And, the inclined portion LGa has a shape inclined downward from the intermediate portion LGb.

As described above, the second lead frame L2 is a control lead frame to which a control signal for controlling the semiconductor element S that is a MOSFET is input.

The vertical thickness Gb of the inclined portion LGa and the intermediate portion LGb is set to be thinner than the vertical thickness Gc of the reference portion LGc, for example, as shown in FIG. 5C.

Further, the vertical thickness of the inclined portion LGa is set to be the same as the vertical thickness Gb of the intermediate portion LGb, for example, as shown in FIG. 5C.

Also, the width of the inclined portion LGa is set to be smaller than the width of the reference portion LGc, for example, as shown in FIG. 5B.

Further, the intermediate portion LGb is formed so that the width of the intermediate portion LGb becomes narrower from the reference portion LGc toward the inclined portion LGa, for example, as shown in FIG. 5B.

Thereby, bending of the one end L2M (the inclined portion LGa) of the second lead frame L2 can be facilitated.

Here, for example, as shown in FIGS. 5A to 5C, the upper surface of the second terminal (the gate terminal) TG of the semiconductor element S has a rectangular shape.

The inclined portion LGa of the one end portion L2M of the second lead frame L2 is located at least on the center TGa on the upper surface of the second terminal TG. Further, the control conductive bonding material HG is located between the lower surface of the inclined portion LGa and the center TGa of the upper surface of the second terminal TG. Thereby, the lower surface of the inclined portion LGa and the upper surface of the second terminal TG are bonded by the control conductive bonding material HG.

In particular, for example, as shown in FIGS. 5A to 5C, the tip of the inclined portion LGa and the upper surface of the second terminal TG are in line contact with each other in a direction parallel to the first side TG1, in a region near the first side TG1 of the upper surface of the second terminal TG that is shifted from the center TGa of the upper surface of the second terminal TG.

Further, as shown in FIG. 5C, the control conductive bonding material HG is continuously provided on the upper surface of the second terminal TG, at least from the region in the vicinity of the first side TG1 where the tip of the inclined portion LGa and the second terminal TG are in contact with each other, to the region in the vicinity of the second side TG2 facing the first side TG1, via the center TGa on the upper surface of the second terminal TG.

In this way, in the second lead frame L2, only the periphery of the junction with the second terminal (gate pad) TG is coined, then, after thinning the plate thickness, the shape is punched again, thereby partially enabling fine processing.

Furthermore, it is possible to provide a space for preventing the control conductive bonding material (solder material) HG from protruding from the second terminal TG when the lead frame is mounted. Further, it is possible to make a partial line contact with the second terminal TG.

It should be noted that the vertical thickness of the second lead frame L2 is the same as the vertical thickness of the first lead frame L1. The one end L1M and the other end L1N of the first lead frame L1 have the same thickness in the vertical direction.

The width of the one end portion L2M of the second lead frame L2 is set to be smaller than the width of the one end portion LM1 of the first lead frame L1.

Thereby, the bending process of the one end portion L2M (the inclined portion LGa) of the second lead frame L2 can be made easier than the one end portion L1M of the first lead frame L1 (that is, the fine processing is facilitated).

And, the inclined portion LGa, having a small thickness, of the second lead frame L2 can be easily formed by bending. Thereby, the area of the second terminal TG can be reduced.

That is, in accordance with the shape of the second terminal TG to which the control signal is input, it is possible to facilitate the processing of the joint portion of the second lead frame L2 connected to the terminal TG. Furthermore, it is possible to suppress the conductive bonding material HG from protruding from the upper surface of the terminal TG, when the terminal TG is bonded to the second lead frame L2.

Second Example

Figure 6:
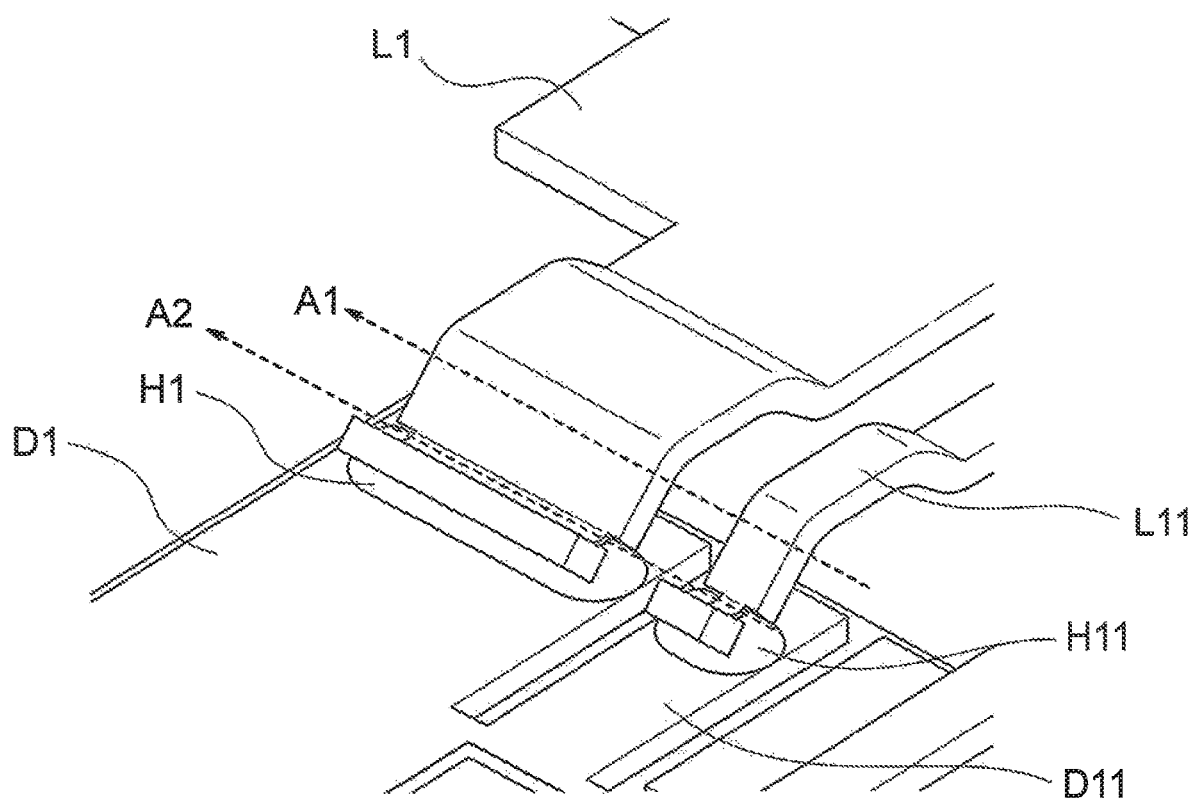
FIG. 6 is an enlarged perspective view of a region in the vicinity of the first lead frame L1 and the detection lead frame L11 of the semiconductor device 100 shown in FIG. 1.
Figure 7:
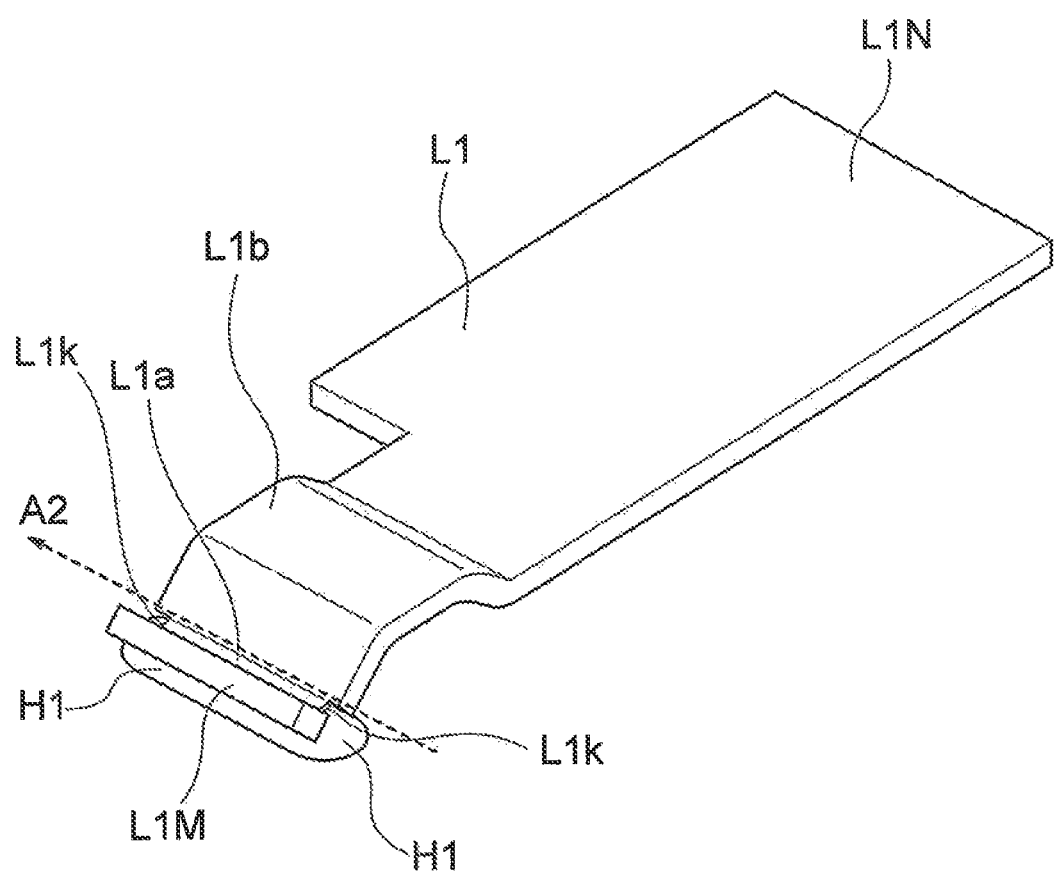
FIG. 7 is a perspective view showing an example of the configuration of the first lead frame L1 and the first conductive bonding material H1 shown in FIG. 6.
Figure 8A:
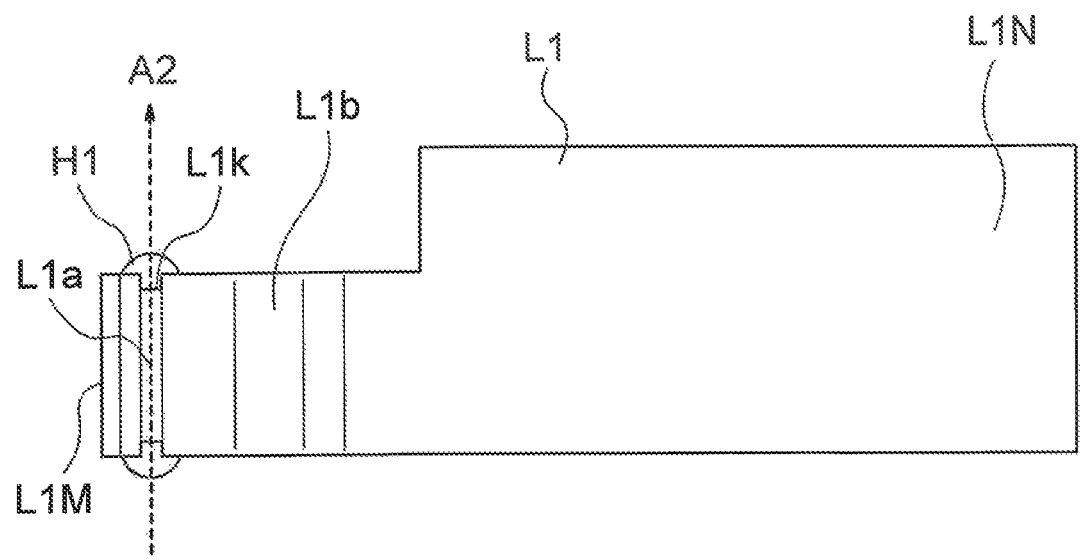
FIG. 8A is a top view showing an example of the configuration of the first lead frame L1 and the first conductive bonding material H1 shown in FIG. 7.
Figure 8B:
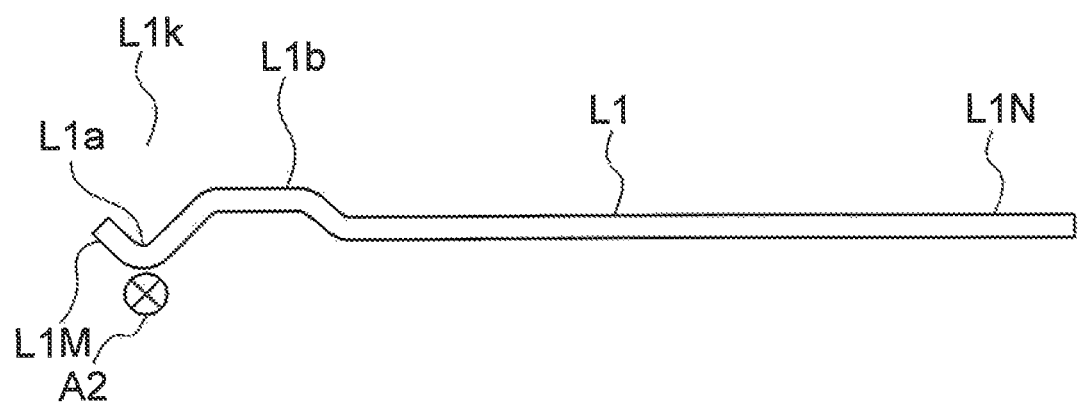
FIG. 8B is a cross sectional view showing an example of the configuration of the first lead frame L1 shown in FIG. 8A.
Figure 9:
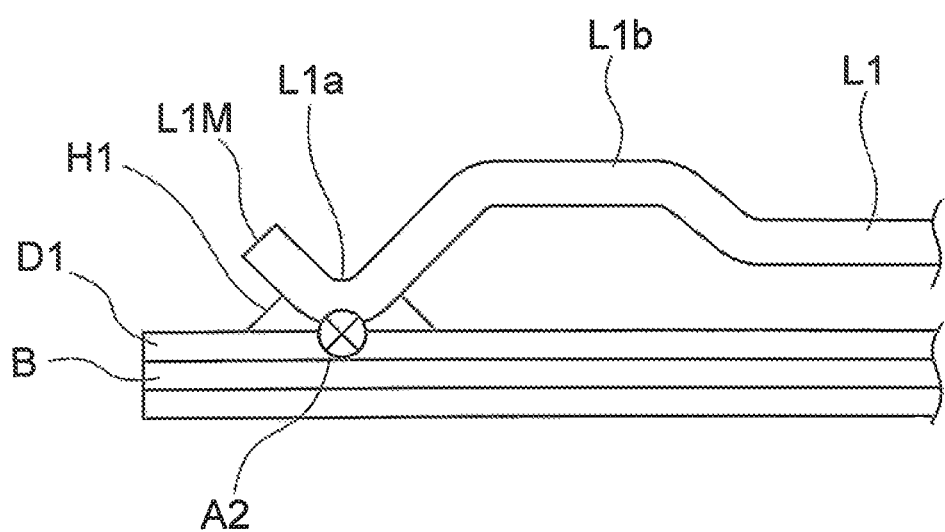
FIG. 9 is a cross sectional view showing an example of a configuration in the vicinity of one end L1M of the first lead frame L1 shown in FIG. 6.

FIG. 6 is an enlarged perspective view of a region in the vicinity of the first lead frame L1 and the detection lead frame L11 of the semiconductor device 100 shown in FIG. 1. FIG. 7 is a perspective view showing an example of the configuration of the first lead frame L1 and the first conductive bonding material H1 shown in FIG. 6. FIG. 8A is a top view showing an example of the configuration of the first lead frame L1 and the first conductive bonding material H1 shown in FIG. 7. FIG. 8B is a cross sectional view showing an example of the configuration of the first lead frame L1 shown in FIG. 8A. FIG. 9 is a cross sectional view showing an example of a configuration in the vicinity of one end L1M of the first lead frame L1 shown in FIG. 6.

For example, as shown in FIGS. 6 to 9, one end portion L1M of the first lead frame L1 includes a first arch portion L1b and a first bent portion L1a.

The first arch portion L1b is provided so as to protrude upward along the reference direction A2.

And, the first bending portion L1a is connected to the first arch portion L1b, and is located in the front end side rather than the first arch portion L1b. Furthermore, the first bent portion L1a is bent so as to protrude downward along the reference direction A2.

The lower surface side of the first bent portion L1a of the first lead frame L1 is in line contact with the upper surface of the first conductive layer D12 along the reference direction A2.

The first conductive bonding material H1 is arranged along the reference direction A2 in which the first bent portion L1a of the first lead frame L1 is in line contact with the upper surface of the first conductive layer D1. The first conductive bonding material H1 bonds between the upper surface of the first conductive layer D1 and the lower surface side of the first bent portion L1a at the end of the substrate B.

Here, as shown in FIGS. 6 to 9, notch portions L1k are formed on the side surfaces on both sides in the reference direction A2 of the portion, in line contact with the first conductive layer D1, of the first bent portion L1a of the first lead frame L1. The notch portions L1k are recessed in the reference direction A2.

And, a part of the first conductive bonding material H1 is embedded in the notch L1k. Thereby, the part of first conductive bonding material H1 has joined between the upper surface of the first conductive layer D1 and the notch portions L1k of the first bending portion L1a.

The first lead frame L1 is arranged, so that the side direction A1, in which the end of the substrate B extends, and the reference direction A2, in which the line-contact region of the first bent portion L1a extends, are parallel to each other, for example, as shown in FIGS. 6 to 9.

The first lead frame L1 has a main body portion that is located between the one end portion L1M and the other end portion L1N, and the main body portion is sealed in the sealing portion 200. And, the position of the upper surface of the first arch portion L1b is higher than the position of the upper surface of the said main body portion.

The width in the side direction A1 of the first arch portion L1b is the same as the width in the side direction A1 other than the cutout portion L1k of the first bent portion L1a. That is, the width in the side direction A1 of the first arch portion L1b is larger than the width in the side direction A1 of the cutout portion L1k of the first bent portion L1a.

Further, for example, the one end L1M and the other end L1N of the first lead frame L1 have the same thickness (that is, the first lead frame L1 is not coined).

Note that the position of the lower surface of the first bent portion L1a is set to be lower than the position of the lower surface of the main body portion.

Then, the first arch portion L1b releases the stress applied to the first lead frame L1 to the sealing portion 200 in the periphery. As a result, application of stress to the first bent portion L1a of the first lead frame L1 is suppressed.

Third Example

In the third example, an example of a method for manufacturing the semiconductor device 100 having the configuration as described above will be described.

FIGS. 10 to 14 are diagrams illustrating an example of a process of a method of manufacturing the semiconductor device 100.

Figure 10:
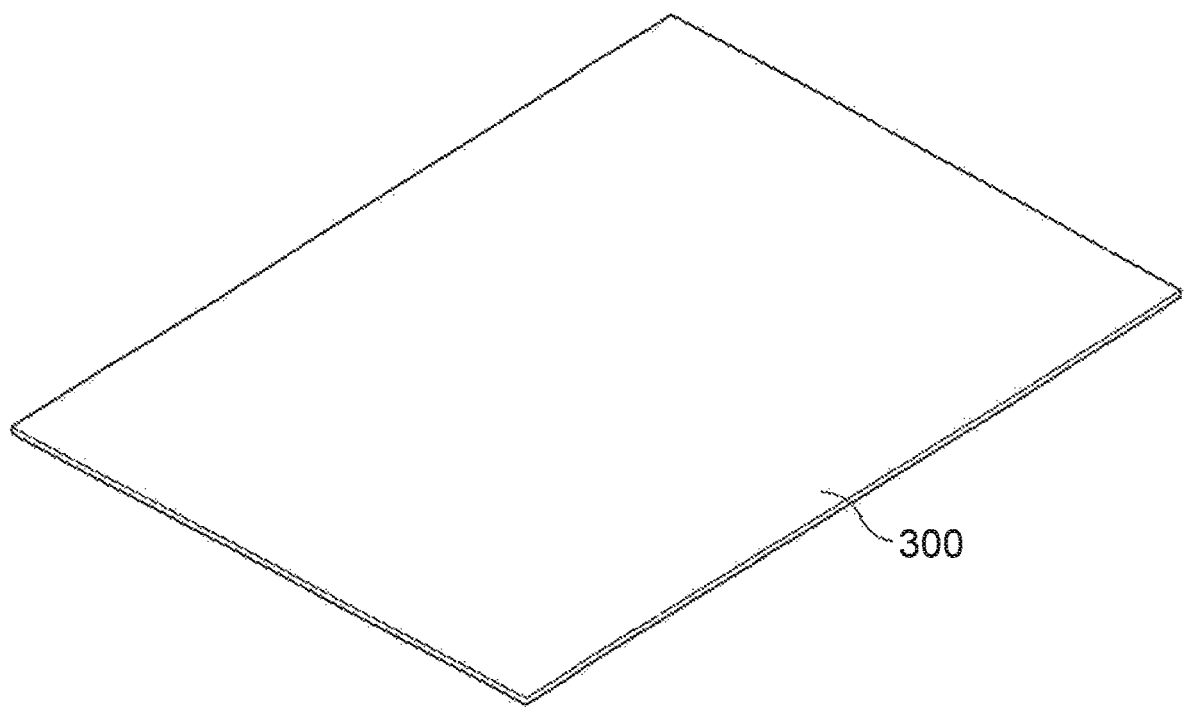
FIG. 10 is a diagram illustrating an example of a process of a method of manufacturing the semiconductor device 100.

First, as shown in FIG. 10, for example, a metal plate 300 made of a metal such as copper is prepared.

Figure 11:
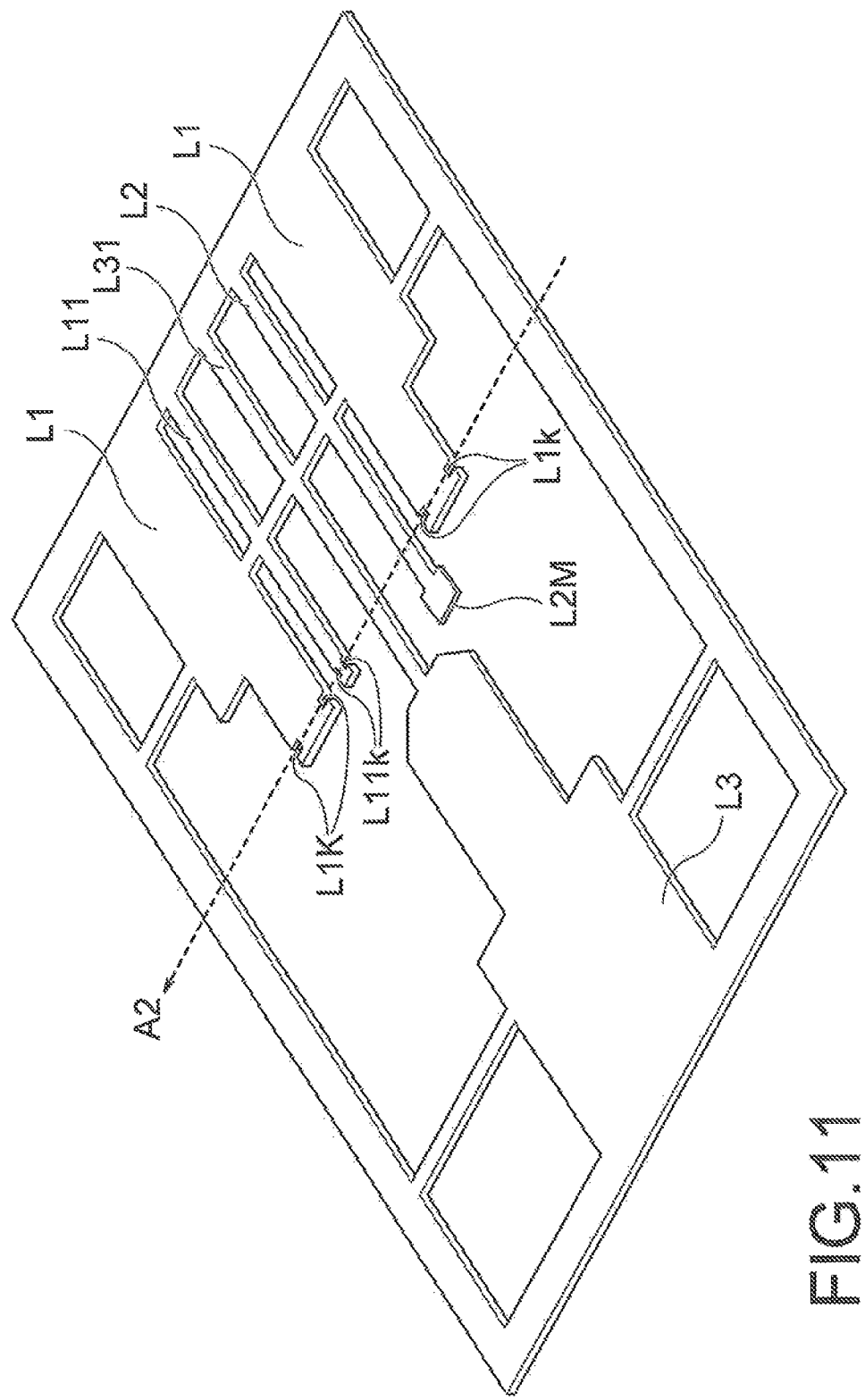
FIG. 11 is a diagram illustrating an example of a process of the method of manufacturing the semiconductor device 100, subsequent to FIG. 10.

Then, as shown in FIG. 11, by selectively punching out the metal plate 300, the first to third lead frames L1 to L3 are simultaneously formed.

In particular, when the first lead frame L1 is formed, notches L1k are formed on both side surfaces in the reference direction A2 of the portion, where the first bent portion L1a of the first lead frame L1 is formed, that is in line contact with the first conductive layer D1. The notches L1k are recessed in the reference direction A2.

Similarly, when forming the second lead frame L2, the portion of the end portion L2M, where the inclined portion LGa and the intermediate portion LGb of the second lead frame L2 are formed, is coined to reduce the plate thickness.

Figure 12:
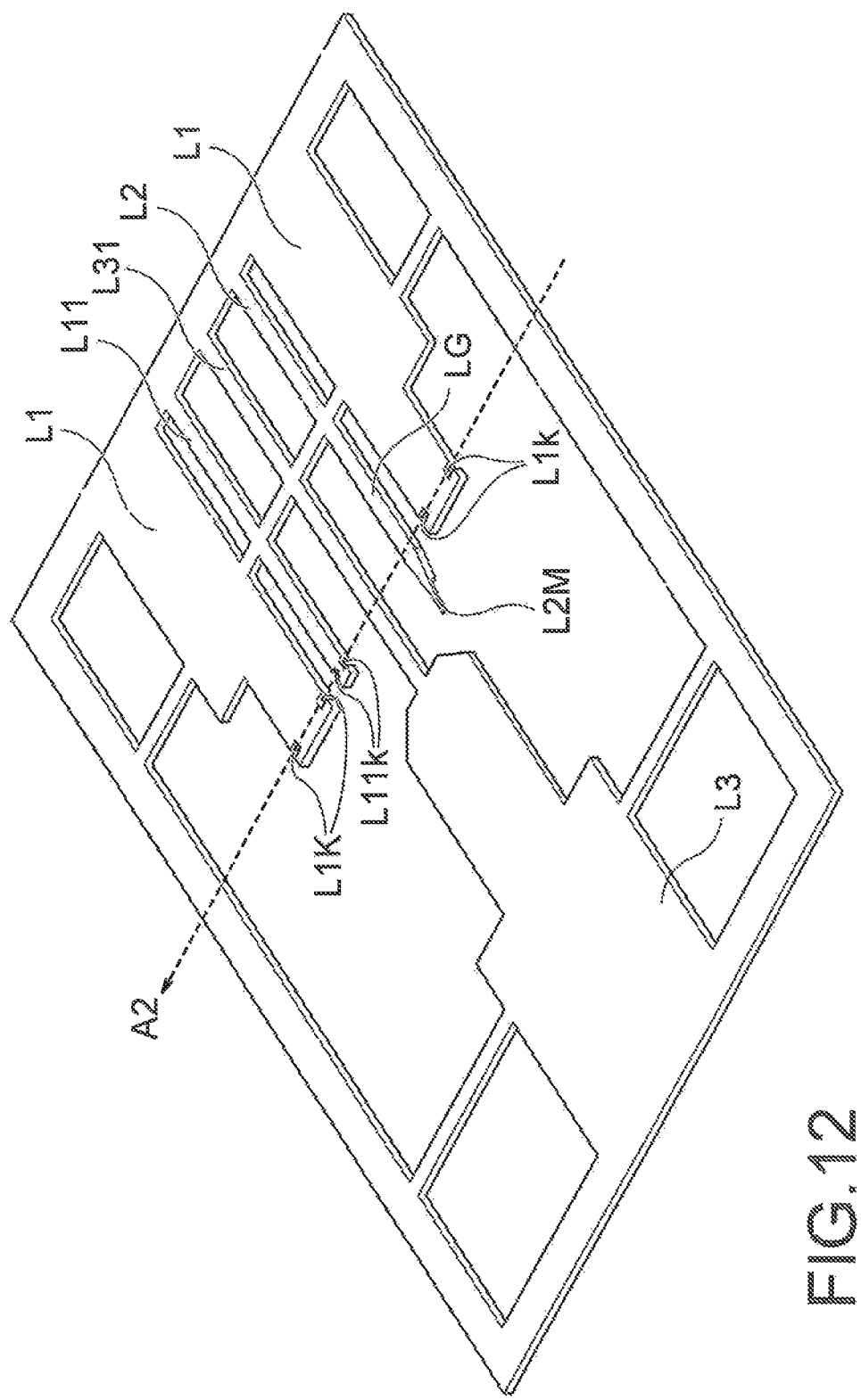
FIG. 12 is a diagram illustrating an example of a process of the method of manufacturing the semiconductor device 100, subsequent to FIG. 11.

Then, as shown in FIG. 12, after reducing the thickness of the end portion L2M where the inclined portion LGa and the intermediate portion LGb of the second lead frame L2 are formed, the shape is punched again.

In this way, only the periphery of the junction with the second terminal (the gate pad) TG of the control lead frame L2 is coined. Further, after reducing the plate thickness, the shape is punched again. Thereby, microfabrication can be partially performed.

Figure 13:
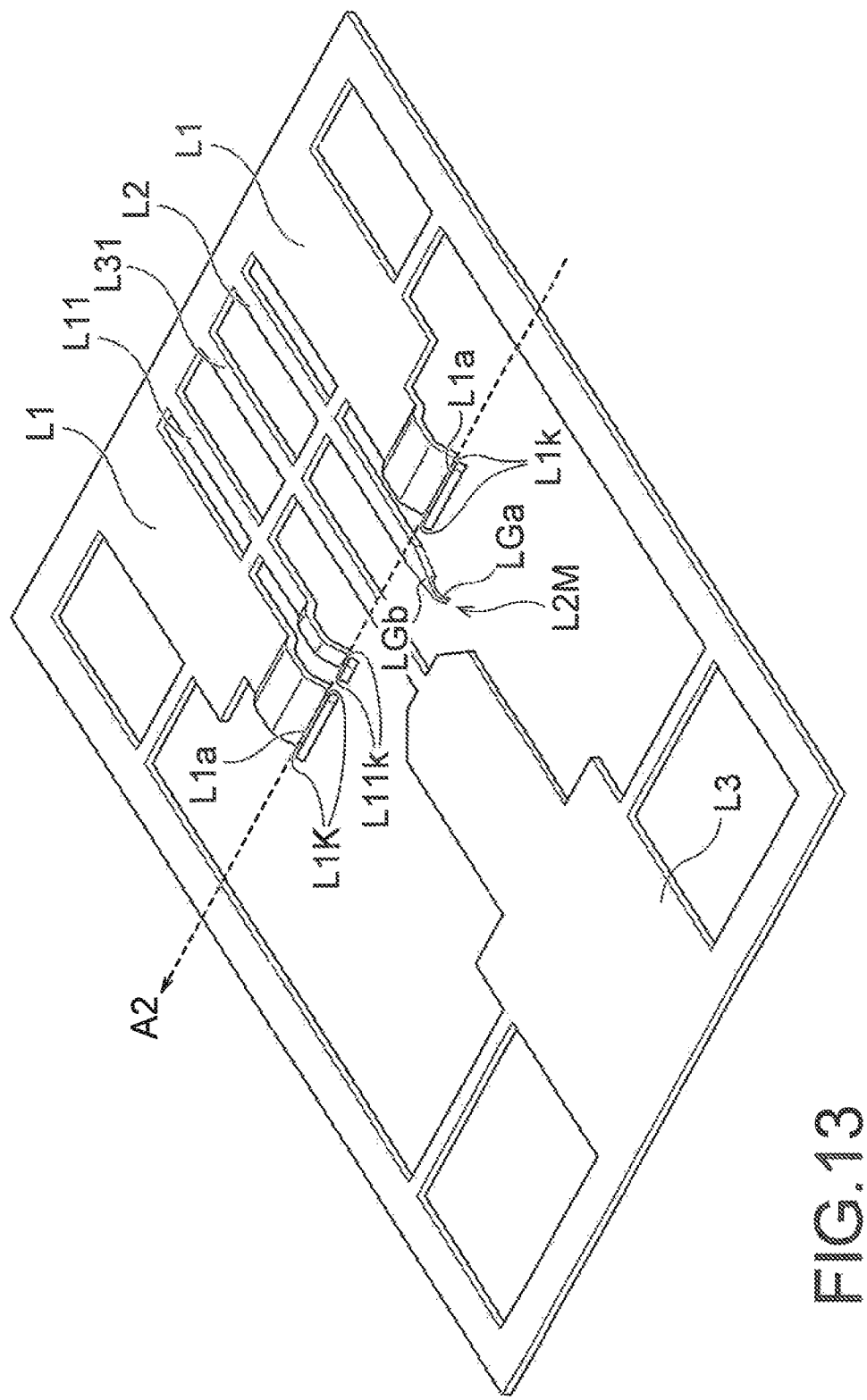
FIG. 13 is a diagram illustrating an example of a process of the method of manufacturing the semiconductor device 100, subsequent to FIG. 12.

Then, as shown in FIG. 13, the one end L1M of the first lead frame L1 is bent so as to protrude downward along the reference direction A2. Thereby, the 1st bending portion L1a is formed.

Further, as shown in FIG. 13, one end L2M of the second lead frame L2 is bent downward along the reference direction A2. Thereby, the intermediate portion LGb and the inclined portion LGa are formed. The intermediate portion LGb is located closer to the tip end side of the one end portion L2M than the reference portion LGc. The inclined portion LGa is connected to the intermediate portion LGb, is located at the tip of the one end L2M, and has a shape inclined downward from the intermediate portion LGb.

Figure 14:
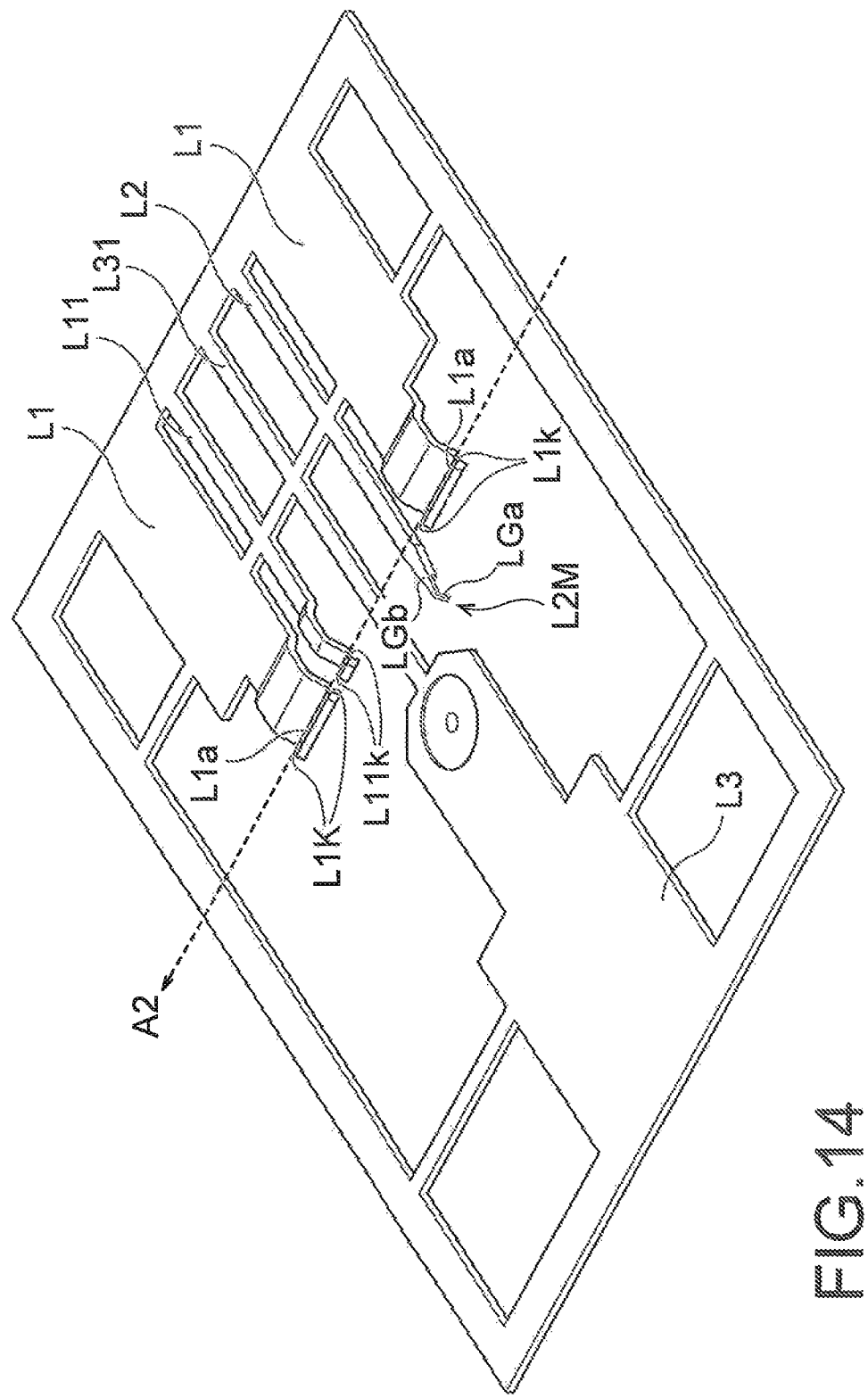
FIG. 14 is a diagram illustrating an example of a process of the method of manufacturing the semiconductor device 100, subsequent to FIG. 13.

Then, as shown in FIG. 14, the third lead frame L3 is subjected to predetermined processing to form a predetermined shape L3X.

Through these steps, for example, the first to third lead frames L1 to L3 shown in FIG. 1 are formed.

Meanwhile, a substrate B having a first conductive layer D1 and a second conductive layer D2 provided on the upper surface is prepared.

Then, the semiconductor element S is arranged on the upper surface of the substrate B. The semiconductor element S has a first terminal TD provided on the lower surface and electrically connected to the first conductive layer D1, and has a second terminal TG provided on the upper surface and to which a control signal is input. Then, by joining the first terminal TD to the first conductive layer D1, the first conductive layer D1 and the first terminal TD are electrically connected.

Then, as shown in FIG. 6, the one end of the first lead frame L1 is brought into contact with the upper surface of the first conductive layer D1 provided at the end of the upper surface of the substrate B. Then, the first conductive bonding material H1 bonds between the upper surface of the first conductive layer and the lower surface side of the first bent portion of the first lead frame L1 at the end of the substrate B. Furthermore, a part of the first conductive bonding material H1 is embedded in the notch portions L1k. Thereby, the upper surface of the first conductive layer D1 and the notch portions L1k of the first bent portion L1a are joined.

Further, as shown in FIGS. 5A to 5C, the one end L2M of the second lead frame L2 is brought into contact with the upper surface of the second terminal (the gate terminal) TG of the semiconductor element. Then, the upper surface of the second terminal TG of the semiconductor element and the one end portion L2M of the second lead frame L2 are bonded by the control conductive bonding material HG having electrical conductivity (FIG. 1).

Further, the one end portion of the third lead frame L3 is brought into contact with the upper surface of the third terminal TS on the upper surface of the semiconductor element S. Then, the third terminal TS and the one end portion of the third lead frame L3 are joined by the source conductive joint material HS having conductivity (FIG. 1).

Then, as shown in FIGS. 2 and 3, the substrate B, the semiconductor element S, the first to third lead frames L1 to L3, and the one end of detection lead frames L11 and L31 are sealed by the sealing portion 200.

Thereafter, by cutting the first to third lead frames L1 to L3 and the detection lead frames L11 and L31, the semiconductor device 100 shown in FIG. 4 is manufactured.

Thus, in this embodiment, after the outer shape of the metal plate 300 is punched, the first and second lead frames L1 and L2 can be formed by two steps of bending the one end of the first and second lead frames L1 and L2. For this reason, the processing cost is reduced, and the thickness of the solder is ensured at the outer peripheral portion of the joint portion, so that stress relaxation is possible.

Further, by forming notch portions (the recessed portions) L1k on both sides of the first bent portion L1a at the tip (the one end portion) of the first lead frame L1, the first bent portion L1a can be easily bent. Furthermore, since the solder flows into the notch L1k, the fixing by the solder can be ensured.

As described above, the tip of the first lead frame L1 is bent by bending. Thus, the bent first bent portion L1a is connected to the first conductive layer D1 by the line contact. For this reason, it is possible to reduce the amount of solder material dispensed.

The semiconductor device according to one embodiment of the present invention includes: a substrate B provided with a first conductive layer D1 on an upper surface of the substrate; a semiconductor element S disposed on the upper surface of the substrate, the semiconductor element has: a first terminal provided on a lower surface of the semiconductor element and electrically connected to the first conductive layer D1, and a second terminal provided on an upper surface of the semiconductor element and receiving a control signal; a sealing portion that seals the substrate and the semiconductor element; a control lead frame (a second lead frame) L2 that has one end in contact with the upper surface of the second terminal of the semiconductor element in the sealing portion, and that has the other end exposed from the sealing portion; and a control conductive bonding material that bonds between the upper surface of the second terminal of the semiconductor element and the one end of the control lead frame, and the control conductive bonding material having electric conductivity.

Furthermore, the one end portion of the control lead frame L2M includes: a reference portion LGc; an intermediate portion LGb connected to the reference portion and located on the tip side of the one end portion of the control lead frame relative to the reference portion; and an inclined portion LGa connected to the intermediate portion LGb and located at the tip of the one end portion of the control lead frame, and the inclined portion having a shape inclined downward from the intermediate portion. And, vertical thickness of the inclined portion and the intermediate portion are thinner than a vertical thickness of the reference portion.

In the semiconductor device of the present invention, for example, only the periphery of the junction with the second terminal (the gate pad) TG of the control lead frame is thinned. Then, after reducing the plate thickness, the shape is punched again. Thereby, the microfabrication can be partially performed.

Furthermore, it is possible to provide a space for preventing the control conductive bonding material (the solder material) HG from protruding from the second terminal when the lead frame is mounted, and to partially make a line contact with the second terminal.

And, the inclined portion, having a small thickness, of the second lead frame L2 can be easily formed by bending. Thereby, the area of the second terminal TG can be reduced.

That is, according to the semiconductor device of the present invention, the joint portion of the lead frame connected to the terminal can be easily processed corresponding to the shape of the terminal to which a control signal is input. Furthermore, it is possible to suppress the conductive bonding material from protruding from the upper surface of the terminal, when the terminal and the lead frame are bonded.

While certain embodiments have been described, these embodiments have been presented by way of example only, and are not intended to limit the scope of the inventions. The embodiments may be embodied in a variety of other forms. Furthermore, various omissions, substitutions and changes in the form of the methods and systems described herein may be made without departing from the spirit of the inventions. The embodiments and their modifications are included in the scope and the subject matter of the invention, and at the same time included in the scope of the claimed inventions and their equivalents.

EXPLANATION OF REFERENCES

100: semiconductor devices
B: substrate
S: semiconductor element
200: sealing portion
L1: first lead frame
L11: detection lead frame
H1: first conductive bonding material
L2: second lead frame
HG: control conductive bonding material
L3: third lead frame
L31: detection lead frame

The invention claimed is:
1. A semiconductor device comprising:
a substrate provided with a first conductive layer on an upper surface of the substrate;
a semiconductor element disposed on the upper surface of the substrate, the semiconductor element has: a first terminal provided on a lower surface of the semiconductor element and electrically connected to the first conductive layer, and a second terminal provided on an upper surface of the semiconductor element and receiving a control signal;
a sealing portion that seals the substrate and the semiconductor element;
a lead frame that has one end in contact with the upper surface of the second terminal of the semiconductor element in the sealing portion, and that has the other end exposed from the sealing portion; and
a control conductive bonding material that bonds between the upper surface of the second terminal of the semiconductor element and the one end of the lead frame, and the control conductive bonding material having electric conductivity,
wherein the one end portion of the lead frame includes:
a reference portion;
an intermediate portion connected to the reference portion and located on the tip side of the one end portion of the lead frame relative to the reference portion; and
an inclined portion connected to the intermediate portion and located at the tip of the one end portion of the lead frame, and the inclined portion having a shape inclined downward from the intermediate portion,
wherein vertical thickness of the inclined portion and the intermediate portion are thinner than a vertical thickness of the reference portion,
wherein the semiconductor device is a MOSFET having the first terminal that is a drain terminal, the second terminal is a gate terminal, and a source terminal, which is a third terminal having an area larger than the second terminal, the source terminal provided on an upper surface of the MOSFET,
wherein the semiconductor device further comprises:
a drain lead frame has one end that is in contact with the upper surface of the first conductive layer at the end extending in the side direction of the upper surface of the substrate in the sealing portion, and has the other end is exposed from the sealing portion; and
a first conductive bonding material that bonds between the upper surface of the first conductive layer and the lower surface side of the one end of the drain lead frame at the end of the substrate, and has electrical conductivity,
wherein the one end portion of the drain lead frame has:
a first arch portion that provided so as to protrude upward along a reference direction, and
a first bent portion that is connected to the first arch portion, and is located closer to a distal end side of the one end portion of the drain lead frame than the first arch portion, and the first bent portion bent along the reference direction so as to protrude downward, and
wherein notches that recessed in the reference direction are formed, in the side surfaces on both sides in the reference direction of a portion, of the first bent portion of the drain lead frame, in line contact with the first conductive layer.

2. The semiconductor device according to claim 1, wherein
the upper surface of the second terminal has a rectangular shape,
the inclined portion is located at least on a center of the upper surface of the second terminal,
the control conductive bonding material is located between the lower surface of the inclined portion and the center of the upper surface of the second terminal, and
the lower surface of the inclined portion and the upper surface of the second terminal are bonded by the control conductive bonding material.

3. The semiconductor device according to claim 2, wherein, in a region near a first side of the upper surface of the second terminal that is offset from the center of the upper surface of the second terminal, a tip of the inclined portion is in line contact with the upper surface of the second terminal in a direction parallel to the first side.

4. The semiconductor device according to claim 3, wherein
the control conductive bonding material is continuously provided from a region of the upper surface of the second terminal near the first side where at least a tip of the inclined portion is in contact with the second terminal, to a region of the upper surface of the second terminal near the second side facing the first side, via the center of the upper surface of the second terminal.

5. The semiconductor device according to claim 4, wherein a vertical thickness of the inclined portion is the same as a vertical thickness of the intermediate portion.

6. The semiconductor device according to claim 5, wherein a width of the inclined portion is smaller than a width of the reference portion.

7. The semiconductor device according to claim 6, wherein the intermediate portion is formed such that a width of the intermediate portion becomes narrower from the reference portion toward the inclined portion.

8. The semiconductor device according to claim 1, wherein the lead frame is a control lead frame to which the control signal for controlling the MOSFET is input, and
wherein a vertical thickness of the control lead frame is the same as a vertical thickness of the drain lead frame.

9. The semiconductor device according to claim 8, wherein a width of the one end portion of the control lead frame is smaller than a width of the one end portion of the drain lead frame.

10. The semiconductor device according to claim 9, wherein the one end portion and the other end portion of the drain lead frame have the same thickness.

11. The semiconductor device according to claim 8, wherein the control conductive bonding material and the first conductive bonding material are the same solder material.

12. The semiconductor device according to claim 9, wherein the first conductive bonding material is disposed along a reference direction in which the first bent portion of the drain lead frame is in line contact with the upper surface of the first conductive layer, and
wherein the end portion of the substrate is joined between the upper surface of the first conductive layer and the lower surface side of the first bent portion.

13. The semiconductor device according to claim 10, wherein the drain lead frame has a main body portion positioned between the one end portion and the other end portion, and the main body portion sealed in the sealing portion.

14. A method of manufacturing a semiconductor device comprising:
preparing a substrate provided with a first conductive layer on an upper surface of the substrate;
disposing a semiconductor element on the upper surface of the substrate, the semiconductor element has: a first terminal provided on a lower surface of the semiconductor element and electrically connected to the first conductive layer, and a second terminal provided on an upper surface of the semiconductor element and receiving a control signal;
bringing one end of a lead frame into contact with the upper surface of the second terminal of the semiconductor element;
bonding between the upper surface of the second terminal of the semiconductor element and the one end of the lead frame by a control conductive bonding material, and the control conductive bonding material having electric conductivity; and
sealing the substrate, the semiconductor element, and the one end of the lead frame by a sealing portion,
wherein the one end portion of the lead frame includes:
a reference portion;
an intermediate portion connected to the reference portion and located on the tip side of the one end portion of the lead frame relative to the reference portion; and
an inclined portion connected to the intermediate portion and located at the tip of the one end portion of the lead frame, and the inclined portion having a shape inclined downward from the intermediate portion,
wherein vertical thickness of the inclined portion and the intermediate portion are thinner than a vertical thickness of the reference portion,
wherein the semiconductor device is a MOSFET having the first terminal that is a drain terminal, the second terminal is a gate terminal, and a source terminal, which is a third terminal having an area larger than the second terminal, the source terminal provided on an upper surface of the MOSFET,
wherein the semiconductor device further comprises:
a drain lead frame has one end that is in contact with the upper surface of the first conductive layer at the end extending in the side direction of the upper surface of the substrate in the sealing portion, and has the other end is exposed from the sealing portion; and
a first conductive bonding material that bonds between the upper surface of the first conductive layer and the lower surface side of the one end of the drain lead frame at the end of the substrate, and has electrical conductivity, wherein the one end portion of the drain lead frame has:
a first arch portion that provided so as to protrude upward along a reference direction, and
a first bent portion that is connected to the first arch portion, and is located closer to a distal end side of the one end portion of the drain lead frame than the first arch portion, and the first bent portion bent along the reference direction so as to protrude downward, and
wherein notches that recessed in the reference direction are formed, in the side surfaces on both sides in the reference direction of a portion, of the first bent portion of the drain lead frame, in line contact with the first conductive layer.

* * * * *